(12) United States Patent
Yamada

(10) Patent No.: US 8,092,278 B2
(45) Date of Patent: Jan. 10, 2012

(54) RECLAMATION METHOD OF SEMICONDUCTOR WAFER

(75) Inventor: Yasunori Yamada, Tokyo (JP)

(73) Assignee: Sumco Corporation, Tokyo (JP)

( * ) Notice: Subject to any disclaimer, the term of this patent is extended or adjusted under 35 U.S.C. 154(b) by 443 days.

(21) Appl. No.: 12/468,308

(22) Filed: May 19, 2009

(65) Prior Publication Data
US 2009/0291621 A1 Nov. 26, 2009

(30) Foreign Application Priority Data

May 22, 2008 (JP) ................. 2008-133894

(51) Int. Cl.
*B24B 1/00* (2006.01)
(52) U.S. Cl. ........................................... 451/44; 451/57
(58) Field of Classification Search ............... 451/44, 451/41, 57, 56, 28
See application file for complete search history.

(56) References Cited

U.S. PATENT DOCUMENTS

| 7,189,149 B2 * | 3/2007 | Katayama et al. ............. 451/56 |
| 7,775,856 B2 * | 8/2010 | Bhatnagar et al. ............. 451/38 |
| 2009/0170406 A1 * | 7/2009 | Kato ............................. 451/44 |

FOREIGN PATENT DOCUMENTS

JP 2000-269174 9/2000

OTHER PUBLICATIONS

English language Abstract of JP 2000-269174, Sep. 29, 2000.

* cited by examiner

*Primary Examiner* — Dung Van Ngyuen
(74) *Attorney, Agent, or Firm* — Greenblum & Bernstein P.L.C.

(57) ABSTRACT

Chamfer correction is performed to a chamfered portion at least on a front side of a silicon wafer after an incoming inspection. Thereby, a thickness of the chamfered portion on the front side of the wafer is restored, and thus the number of reclamation cycles of the silicon wafer can be increased. In addition, the chamfered portion is not deformed even after reclamation is repeated for a plurality of times.

2 Claims, 3 Drawing Sheets

US 8,092,278 B2

RECLAMATION METHOD OF SEMICONDUCTOR WAFER

CROSS-REFERENCE TO RELATED APPLICATIONS

The present application claims priority under 35 U.S.C. §119 of Japanese Application No. 2008-133894 filed on May 22, 2008, the disclosure of which is expressly incorporated by reference herein in its entirety.

BACKGROUND OF THE INVENTION

1. Field of the Invention

The present invention relates to a reclamation method of a semiconductor wafer, more specifically, a reclamation method of a semiconductor wafer in which the number of reclamation cycles can be increased.

2. Description of Related Art

In a device forming process, a variety of inspections are performed in a variety of important processes of operation by using test wafers. The test wafers are obtained from a same ingot from which silicon wafers shipped from a wafer fabrication plant are obtained. In the device forming process, defective wafers are produced in each process of operation, representing about 30% of the entire processed wafers. The test wafers and defective wafers are generally transferred to a reclamation line, instead of being disposed of, and then recycled as reclaimed polished wafers having an equivalent level to new wafers (refer to Related Art 1, for example). Wafer reclamation described above is considered to be performed more frequently for wafers having larger diameters, such as, for example, silicon wafers having a diameter of 450 mm and the like.

Silicon wafers used as reclamation material vary in type. Examples of the silicon wafers include but are not limited to bare wafers, wafers having an oxide film, wafers having a nitrogen film, wafers having a polysilicon film, diffused wafers, epitaxial wafers, resist-coated wafers, metal-coated wafers, patterned wafers, wafers having a multilayer film, and the like. In a conventional reclamation process, silicon wafers received as reclamation material undergo incoming inspections, such as sorting by film type, an appearance inspection, and the like. Then, the silicon wafers sequentially undergo grinding of a front surface, on which various films and devices are formed; mirror-polishing of a wafer external peripheral surface; and mirror-polishing of the front surface.

[Related Art 1] Japanese Patent Laid-open Publication No. 2000-269174

In the conventional wafer reclamation process, as described above, the front surface of the wafer is ground to remove a variety of films, including an oxide film, and devices formed thereon. Thus, the more the number of reclamation cycles of a silicon wafer is, the thinner the wafer is on the front surface side from grinding in each reclamation cycle. As a result, a chamfer width on the front side of the wafer is narrowed, and thus effectiveness is reduced in forming a chamfered portion on the front side of the wafer. Problems occur accordingly, inducing chipping in the external peripheral portion of the wafer at the time of polishing of the front surface of the wafer, and wafer cracking in a device forming process. In addition, repeated reclamation of the silicon wafer may result in deformation in the chamfered portion of the wafer due to external periphery sagging and the like at the time of polishing of the silicon wafer. In order to prevent the problems, the number of wafer reclamation is conventionally limited to only a few times.

SUMMARY OF THE INVENTION

As a result of diligent research, the inventor has found that chamfer correction is effective, in which a shape of an external periphery portion (chamfered portion) of a silicon wafer is corrected when the silicon wafer is determined correctable at incoming inspection. The inventor has thus discovered that chamfer correction recovers (restores) the chamfered portion on the front side of the silicon wafer to a condition of a substantially new wafer; and that the number of reclamation cycles of a silicon wafer can be increased compared to the conventional wafer reclamation process. Thereby, the inventor has completed the present invention.

A non-limiting feature of the present invention is to provide a reclamation method of a semiconductor wafer in which the number of reclamation cycles of the wafer can be increased.

A first aspect of the present invention provides a reclamation method of a semiconductor wafer including performing chamfer correction in which a chamfered shape is corrected for a chamfered portion of the semiconductor wafer at least on a front side thereof; polishing at least a front surface of the semiconductor wafer, subsequent to the chamfer correction; and mirror-chamfering the chamfered portion of the semiconductor wafer having undergone the correction of the chamfered shape, subsequent to the chamfer correction.

According to the first aspect of the present invention, chamfer correction is performed to the chamfered portion (external peripheral portion) at least on the front side of the semiconductor wafer for reclamation. Conventionally, the chamfered portion on the front side of the wafer only gets thin from surface grinding, every time the wafer reclamation process is repeated. Chamfer correction, however, can restore the thickness of the chamfered portion on the front side of the wafer, and thus increases the thickness of the chamfered portion on the front side of the wafer. Further, repeated reclamation may deform the chamfered portion of the wafer. However, correcting the shape of the chamfered portion can also eliminate the problem. Thereby, compared to the conventional wafer reclamation process, the number of reclamation cycles of the semiconductor wafer can be increased. After the chamfered portion of the semiconductor wafer is corrected, the chamfered portion is mirror-chamfered and the front surface of the wafer is polished in a predetermined order.

The "semiconductor wafer for reclamation" may be a semiconductor wafer to be reclaimed for the first time, or a semiconductor wafer having undergone a reclamation process once or more, including front surface grinding of the semiconductor wafer. A monocrystalline silicon wafer, a polysilicon wafer, and the like may be employed as the semiconductor wafer. The semiconductor wafer may be obtained from a wafer fabrication process or a device forming process. Examples of the semiconductor wafer in view of types include but are not limited to bare wafers, wafers having an oxide film, wafers having a nitrogen film, wafers having a polysilicon film, diffused wafers, epitaxial wafers, resist-coated wafers, metal-coated wafers, patterned wafers, wafers having a multilayer film, and the like.

A diameter of the semiconductor wafer may be, for example, 200 mm, 300 mm, 450 mm, and the like. The larger the diameter of the wafer is, the more expensive a unit price of the wafer is, and thus the more often the semiconductor wafer is reclaimed. The "chamfered portion of a semiconductor wafer" refers to an area chamfered in the external peripheral portion of the wafer. The "chamfered portion . . . on a front side of the wafer" refers to a chamfered portion of the semiconductor wafer present on the front side of the wafer with respect to a virtual line extending in a diameter direction of the semiconductor wafer at a half height of an external edge surface, at a cross section (plane) orthogonal to the front surface and rear surface of the wafer. A device is formed on the front surface of the wafer.

A chamfered portion of the semiconductor wafer present on the rear side of the wafer with respect to the virtual line at the cross section (plane) orthogonal to the front surface and rear surface of the wafer is referred to as a chamfered portion on the rear side of the wafer. The semiconductor wafer for reclamation is fabricated in a process in which monocrystalline semiconductor material pulled in the Czochralski process, for example, is ground on an external periphery, cut into blocks, and sliced in sequence, and thus wafers are processed. Thereafter, the obtained wafers are chamfered, lapped, and etched in the order, and thereby provided as semiconductor wafers.

Chamfer correction corrects the chamfered portion on the front side of the semiconductor wafer, or on the both front and rear sides of the semiconductor wafer. Chamfer correction is chamfering in which the shape of the chamfered portion at least on the front side of the wafer is corrected (re-formed), such that the chamfered portion on the front side of the wafer is thicker after the correction compared to before the correction.

Specifically, a grinding stone for chamfering is used, for example, for chamfer correction, the grinding stone being formed of bonded diamond abrasive grains and having an annular groove on a peripheral side surface. At a cross section including a rotation shaft of the grinding stone for chamfering, the annular groove includes a linear end surface, an upwardly inclined surface gradually inclined upward toward an external side, and a downwardly inclined surface gradually inclined downward toward the external side. In chamfering, the external edge surface of the semiconductor wafer is pressed against the end surface of the grinding stone for chamfering, and thus the portion is ground. The chamfered portion on the front side of the semiconductor wafer is pressed against the upwardly inclined surface, and thus the portion is ground. The chamfered portion on the rear side of the semiconductor wafer is then pressed against the downwardly inclined surface, and thus the portion is ground. The three portions may be chamfered in a predetermined order or simultaneously. The shape of the chamfered portion on the front side of the wafer and the chamfered portion on the rear side of the wafer may be linear or curved at the cross section including the rotation shaft of the grinding stone for chamfering.

A chamfered amount of the chamfered portion on the front side of the wafer is 20 $\mu$m to 400 $\mu$m. When the amount is less than 20 $\mu$m, the shape of the chamfered portion is not corrected evenly on an entire periphery. When the amount exceeds 400 $\mu$m, a diameter of the wafer changes substantially. A preferable chamfered amount of the chamfered portion on the front side of the wafer is 100 $\mu$m or less. Within the range, change in the wafer diameter is minimized and the shape of the chamfered portion can be corrected. Thereby, a preferable effect is obtained in which the number of wafer reclamation cycles is further increased.

In mirror-chamfering, the chamfered portion (chamfered surface) of the semiconductor wafer is pressed against a cloth or buff rotating around a perpendicular rotation shaft, while an abrasive compound is being supplied. Thus, the chamfered surface of the chamfered portion is mirror-finished and polished. In polishing, at least the front surface of the semiconductor wafer is pressed against a polishing cloth rotating around a perpendicular shaft, while an abrasive compound is being supplied. Only the front surface of the semiconductor wafer may be polished. Alternatively, both the front and rear surfaces of the semiconductor wafer may be polished. Further, single-side polishing (front-side polishing, or rear-side polishing followed by front-side polishing) or simultaneous double-side polishing may be employed. With respect to the order of mirror-chamfering and polishing, mirror-chamfering may be performed first, followed by polishing. Alternatively, polishing may be performed, followed by mirror-chamfering. Further, mirror-chamfering may be performed first, followed by polishing, and then mirror-chamfering may further be performed.

A second aspect of the present invention provides a reclamation method of a semiconductor wafer including performing an incoming inspection in which it is inspected whether a front surface of the semiconductor wafer for reclamation needs to be ground; grinding the front surface of the semiconductor wafer when the front surface of the semiconductor wafer needs to be ground, subsequent to the incoming inspection; performing chamfer correction in which a chamfered shape is corrected for a chamfered portion of the semiconductor wafer at least on a front side thereof, one of immediately before and immediately after the grinding; mirror-chamfering the chamfered portion of the semiconductor wafer having undergone the correction of the chamfered shape, subsequent to the chamfer correction; and polishing at least the front surface of the semiconductor wafer, subsequent to the chamfer correction.

According to the second aspect of the present invention, the semiconductor wafer is ground after the incoming inspection, when the front surface of the semiconductor wafer needs to be ground. Immediately before or after the grinding, chamfer correction is performed to the chamfered portion of the semiconductor wafer at least on the front side. Thus, the thickness of the chamfered portion on the front side of the wafer is increased. Conventionally, the chamfered portion on the front side of the wafer only becomes thinner from surface grinding, every time the wafer reclamation process is repeated. However, the thickness of the chamfered portion on the front side of the wafer can be restored. Further, repeated reclamation of the semiconductor wafer deforms the chamfered portion of the wafer. However, correcting the shape of the chamfered portion can also eliminate the problem. Thereby, compared to the conventional wafer reclamation process, the number of reclamation cycles of the semiconductor wafer can be increased.

Subsequently, after the chamfered portion of the semiconductor wafer is corrected, the chamfered portion is mirror-chamfered and the front surface of the wafer is ground in a predetermined order. In grinding, the front surface of the semiconductor wafer is ground by a grinding stone having a flat plate shape or a cup shape. The grinding stone grinds the front surface of the silicon wafer, and thus removes an oxide film and the like on the front surface of the wafer. A grinding amount of the front surface of the wafer is appropriately changed in accordance with a film formed on the front surface of the wafer and roughness of the front surface of the wafer. In addition to the inspection of whether or not the front surface of the semiconductor wafer needs to be ground, other incoming inspections include sorting by type of a film formed on the front or rear surface of the semiconductor wafer, an appearance inspection, and the like. Chamfer correction may be performed immediately before or after the grinding.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 1:
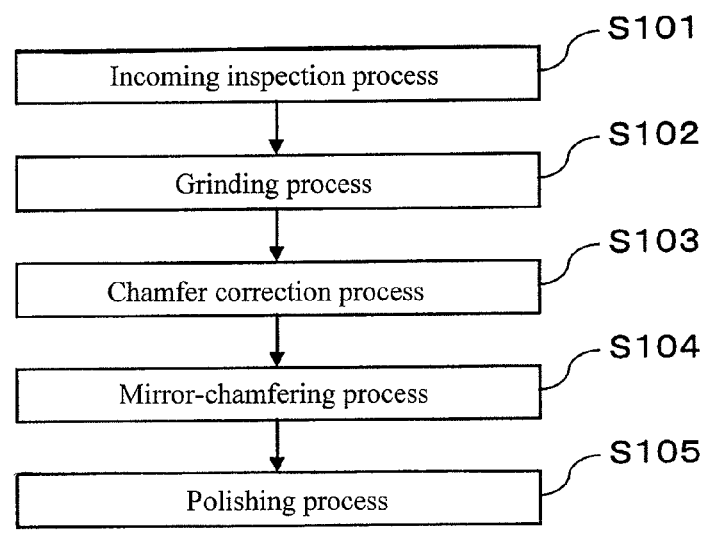
FIG. 1 is a flow sheet illustrating an entire flow of a reclamation method of a semiconductor wafer according to a first embodiment of the present invention.

The embodiments of the present invention are explained below in a concrete manner. A reclamation method of a semiconductor wafer according to a first non-limiting embodiment of the present invention is explained with reference to FIGS. 1 to 3. As shown in the drawings, the reclamation method of the semiconductor wafer according to the first embodiment of the present invention includes an incoming inspection process (S101), a grinding process (S102), a chamfer correction process (S103), a mirror-chamfering process (S104), and a polishing process (S105). In the incoming inspection process (S101), a reclaimed silicon wafer (semiconductor wafer) 10 is inspected upon receipt, the reclaimed silicon wafer having undergone reclamation at least once, including front surface grinding. Subsequently, a front surface 10a of the silicon wafer 10 is ground in the grinding process (S102). Immediately after the grinding process, a shape of a chamfered portion of the silicon wafer 10 is corrected so as to increase the thickness of a chamfered portion b on a front side of the wafer in the chamfer correction process (S103). Thereafter, the chamfered portion of the silicon wafer 10 having undergone correction of the chamfered shape is mirror-chamfered in the mirror-chamfering process (S104). Then, the front surface of the silicon wafer 10 is polished in the polishing process (S105).

The silicon wafer 10 is a wafer having an oxide film and obtained in a device forming process. The silicon wafer 10 is a monocrystalline silicon wafer having a diameter of 300 mm and a mirror-polished front surface (device forming surface) 10a. A chamfered portion of the silicon wafer 10 refers to an area of 1 mm from an outmost periphery toward the diametrical center of the wafer. At a cross section orthogonal to the front surface 10a and a rear surface 10b, a shape of the chamfered potion of the silicon wafer 10 includes a linear external edge surface, a linear front chamfered surface, and a linear rear chamfered surface. The external edge surface is provided orthogonal to the front and rear surfaces of the wafer. The front chamfered surface connects the external edge surface and the front surface 10a. The rear chamfered surface connects the external edge surface and the rear surface 10b.

Figure 2:
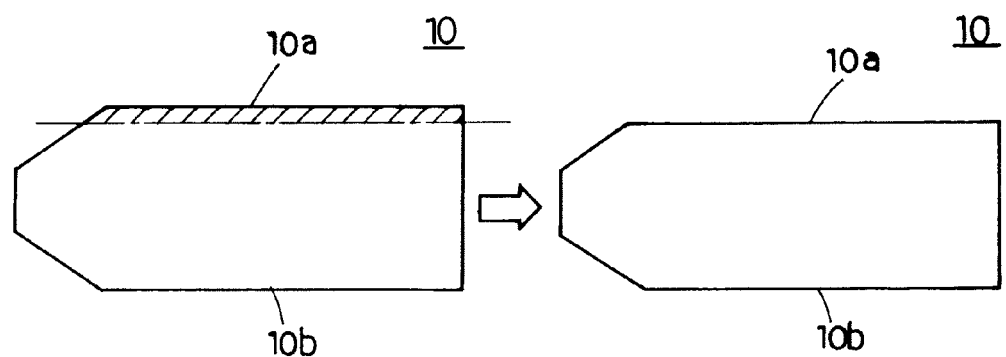
FIG. 2 is a flow sheet illustrating a front surface grinding process in the reclamation method of the semiconductor wafer according to the first embodiment of the present invention.

In the incoming inspection process (S101), it is inspected whether or not the front surface of the silicon wafer 10 for reclamation needs to be ground. Whether to perform front surface grinding is visually inspected and determined based on the presence of a film on the front surface of the wafer, roughness of the front surface of the wafer, external periphery sagging of the front surface of the wafer, and the like. Other incoming inspections include sorting by film type, an appearance inspection, a front surface washability test, and the like. When it is determined reclaimable in the incoming inspection, the silicon wafer 10 is then transferred to the grinding process (S102), in which the front surface is ground by a front surface grinder. More specifically, the front surface 10a of the silicon wafer 10 is ground by a grinding stone, which is formed of diamond abrasive grains bonded with synthetic resin as a binder, and thus the oxide film and the like on the front surface 10a of the wafer are removed (FIG. 2). In this process, since the front surface 10a of the wafer is ground, a chamfer width on the front side of the wafer is reduced, the chamfer width being a shortest distance from the external periphery of the front chamfered portion to an internal periphery thereof when the front surface of the wafer is viewed.

Thereafter, the silicon wafer 10 having undergone front surface grinding is transferred to the chamfer correction process (S103). In the process, a shape is corrected of the warped chamfered portion of the wafer by using a grinding stone for chamfering. The grinding stone for chamfering is a grinding stone formed of bonded diamond abrasive grains and is provided with an annular groove on a peripheral side surface. At a cross section including a rotation shaft of the grinding stone, the annular groove includes a linear end surface, an upwardly inclined surface, and a downwardly inclined surface. The upwardly inclined surface is gradually inclined upward toward an external side. The downwardly inclined surface is gradually inclined downward toward the external side.

Figure 3:
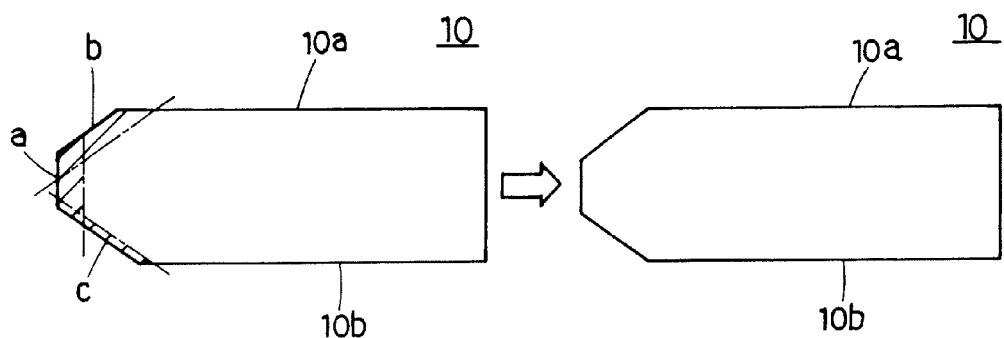
FIG. 3 is a flow sheet illustrating a chamfer correction process in the reclamation method of the semiconductor wafer according to the first embodiment of the present invention.

In chamfering, an external edge portion a of the silicon wafer 10 is first pressed against the end surface of the annular groove of the rotating resinoid grinding stone for chamfering, and thus the portion is ground (FIG. 3). Subsequently, a chamfered portion b on the front side of the wafer is pressed against the upwardly inclined surface of the annular groove, and thus the portion is ground. A chamfered portion c on the rear side of the wafer is then pressed against the downwardly inclined surface of the annular groove, and thus the portion is ground, such that the chamfer width is equal to the chamfer width of the chamfered portion b on the front side of the wafer. Thereby, the chamfered portions of the silicon wafer are corrected to a shape again similar to an original shape at the time of product shipping. However, the wafer is thinner for an amount of the front surface grinding.

The silicon wafer 10 having undergone chamfer correction is transferred to the mirror-chamfering process (S104). In the process, the chamfered portion of the wafer is mirror-chamfered. More specifically, the chamfered portion (chamfered surface) of the wafer is pressed against a cloth or buff rotating around a perpendicular rotation shaft, while an abrasive compound is being supplied. Thus, the chamfered surface of the chamfered portion is mirror-finished and polished. Thereby, grinding damage from the chamfer correction is removed from the chamfer portion of the wafer. Thereafter, the mirror-chamfered silicon wafer 10 is transferred to the polishing process (S105). In the process, the silicon wafer 10 is attached to a lower surface of a polishing head of a single-side polisher, while the front surface of the wafer is faced downward. In this state, the rotation head is gradually moved downward, and then the front surface 10a of the wafer is pressed against a polishing cloth attached onto a rotating grinding platen. Thereby, the front surface 10a of the wafer is finished and polished. Thereafter, the mirror-polished silicon wafer 10 undergoes washing and a final inspection, and then is provided as a reclaimed wafer.

As described above, chamfer correction is performed to the chamfered portion (external peripheral portion) b at least on the front side of the silicon wafer 10. Thus, the thickness of the chamfered portion b on the front side of the wafer is restored (increased). In addition, deformation in the chamfered portion of the wafer associated with repeated reclamation of the silicon wafer 10 is also eliminated. Thereby, compared with the conventional wafer reclamation process, the number of reclamation cycles can be increased for the silicon wafer 10.

Figure 4:
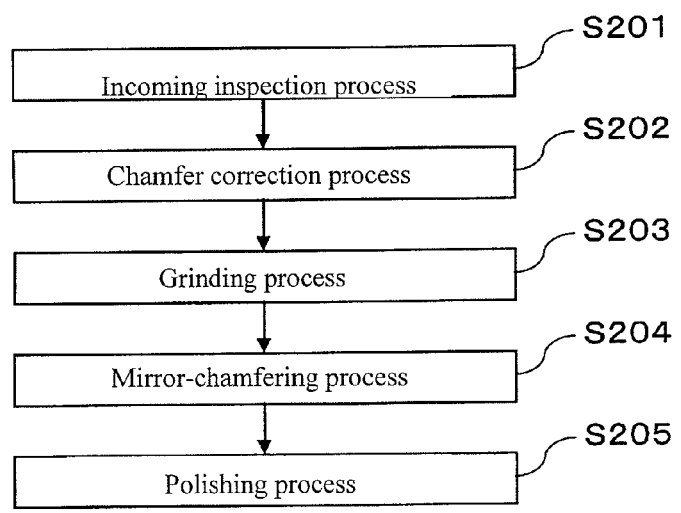
FIG. 4 is a flow sheet illustrating an entire flow of a reclamation method of a semiconductor wafer according to a second embodiment of the present invention.

A reclamation method of a semiconductor wafer according to a second non-limiting embodiment of the present invention is explained below with reference to FIG. 4. As shown in a flow sheet of FIG. 4, in the reclamation method of the semiconductor wafer according to the second embodiment of the present invention, an incoming inspection process (S201), a chamfer correction process (S202), a grinding process (S203), a mirror-chamfering process (S204), and a polishing process (S205) are sequentially performed. Immediately after the incoming inspection, a shape of a chamfered portion of the silicon wafer 10 is corrected so as to increase the thickness of a chamfered portion b on a front side of the wafer in the chamfer correction process (S202). In the grinding process (S203), a front surface 10a of the silicon wafer 10 having undergone chamfer correction is ground. Other structures, functions, and effects are the same as those in the first embodiment, and thus explanations thereof are omitted.

Figure 5:
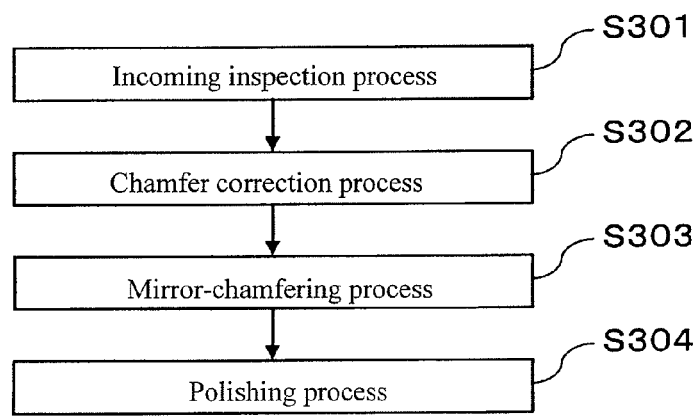
FIG. 5 is a flow sheet illustrating an entire flow of a reclamation method of a semiconductor wafer according to a third embodiment of the present invention.
Figure 6:
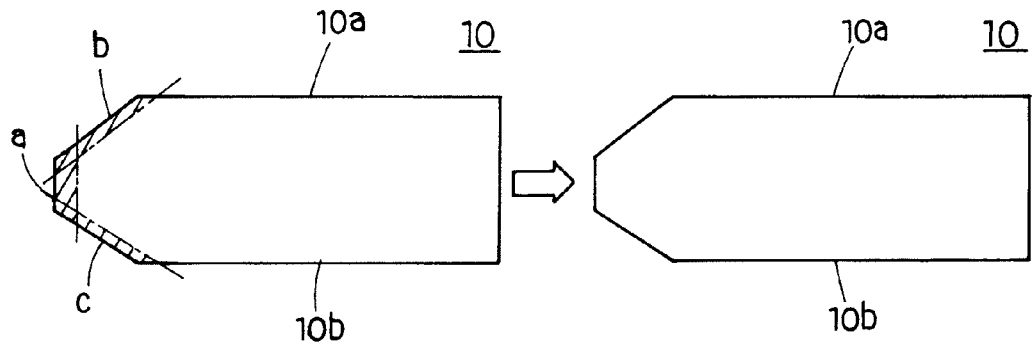
FIG. 6 is a flow sheet illustrating a chamfer correction process in the reclamation method of the semiconductor wafer according to the third embodiment of the present invention.

A reclamation method of a semiconductor wafer according to a third non-limiting embodiment of the present invention is explained below with reference to FIGS. 5 and 6. As shown in a flow sheet of FIG. 5, in the reclamation method of the semiconductor wafer according to the third embodiment of the present invention, an incoming inspection process (S301), a chamfer correction process (S302), a mirror-chamfering process (S303), and a polishing process (S304) are sequentially performed. In the present embodiment, a grinding process is eliminated from a series of the wafer reclamation process of the first and second embodiments. Front surface grinding can be eliminated from the wafer reclamation process, when a front surface film can be removed from a wafer by etching or other methods. In the third embodiment, after the silicon wafer 10 undergoes the incoming inspection, a film on a front surface of the wafer is removed by etching, for instance. Then, the silicon wafer 10 is transferred to the chamfer correction process. In the process, a chamfer grinding stone sequentially chamfers an external edge portion a of the silicon wafer 10, a front side chamfer portion b of the silicon wafer 10, and a rear side chamfer portion c of the silicon wafer 10 (FIG. 6). Other structures, functions, and effects are the same as those in the first embodiment, and thus explanations thereof are omitted.

The present invention is effective as a reclamation method of substrate wafers, such as, for example, bare wafers, wafers having an oxide film, wafers having a nitrogen film, wafers having a polysilicon film, diffused wafers, epitaxial wafers, resist-coated wafers, metal-coated wafers, patterned wafers, wafers having a multilayer film, and the like. In addition, the present invention is effective as a reclamation method of test wafers in a variety of operations in a wafer fabrication process and a device forming process.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A reclamation method of a semiconductor wafer comprising:
    performing chamfer correction in which a chamfered shape is corrected for a chamfered portion of the semiconductor wafer at least on a front side thereof;
    polishing at least a front surface of the semiconductor wafer, subsequent to the chamfer correction; and
    mirror-chamfering the chamfered portion of the semiconductor wafer having undergone the correction of the chamfered shape, subsequent to the chamfer correction.

2. A reclamation method of a semiconductor wafer comprising:
    performing an incoming inspection, in which it is inspected whether a front surface of the semiconductor wafer for reclamation needs to be ground;
    grinding the front surface of the semiconductor wafer when the front surface of the semiconductor wafer needs to be ground, subsequent to the incoming inspection;
    performing chamfer correction in which a chamfered shape is corrected for a chamfered portion of the semiconductor wafer at least on a front side thereof, one of immediately before and immediately after the grinding;
    mirror-chamfering the chamfered portion of the semiconductor wafer having undergone the correction of the chamfered shape, subsequent to the chamfer correction; and
    polishing at least the front surface of the semiconductor wafer, subsequent to the chamfer correction.

* * * * *